(12) United States Patent
Wang et al.

(10) Patent No.: US 7,269,020 B2
(45) Date of Patent: Sep. 11, 2007

(54) BEZEL MOUNTING DEVICE

(75) Inventors: Yu-Jiun Wang, Tu-Chen (TW); Ching-Mao Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 96 days.

(21) Appl. No.: 10/844,896

(22) Filed: May 12, 2004

(65) Prior Publication Data

US 2004/0228083 A1 Nov. 18, 2004

(30) Foreign Application Priority Data

May 14, 2003 (TW) .............................. 92208811 U

(51) Int. Cl.
*H05K 7/16* (2006.01)
(52) U.S. Cl. .................... 361/727; 361/724; 312/223.2
(58) Field of Classification Search ........ 361/724–727; 312/223.1–223.2
See application file for complete search history.

(56) References Cited

U.S. PATENT DOCUMENTS

| | | | |
|---|---|---|---|
| 5,816,672 | A | 10/1998 | LaPointe et al. |
| 6,209,979 | B1 * | 4/2001 | Fall et al. ................. 312/330.1 |
| 6,259,905 | B1 * | 7/2001 | Berkowitz et al. .......... 455/401 |
| 6,373,690 | B1 * | 4/2002 | Buican et al. .............. 361/683 |
| 6,719,149 | B2 * | 4/2004 | Tomino ........................ 211/26 |
| 6,748,155 | B2 * | 6/2004 | Kim et al. ................... 385/135 |
| 6,788,544 | B1 * | 9/2004 | Barsun et al. .............. 361/727 |
| 2002/0093785 | A1 * | 7/2002 | Chi et al. .................... 361/679 |
| 2003/0039099 | A1 * | 2/2003 | Chen .......................... 361/727 |
| 2003/0210514 | A1 * | 11/2003 | Liu et al. .................... 361/683 |
| 2004/0184243 | A1 * | 9/2004 | Mease et al. ............... 361/725 |

FOREIGN PATENT DOCUMENTS

TW 482370 4/2002

* cited by examiner

*Primary Examiner*—Jayprakash Gandhi
*Assistant Examiner*—Ingrid Wright
(74) *Attorney, Agent, or Firm*—Wei Te Chung

(57) ABSTRACT

A mounting device, for mounting a bezel (50) to cover an opening of a chassis (10) which is received in a cabinet (4), includes a pair of sliding units (20), a locking plate (30) attached to the chassis and the cabinet, and a pair of bent plates attached to opposite ends of the bezel. The sliding unit includes a horizontal member (22) attached to the chassis, a vertical member attached to the bezel, and a sliding member horizontally movably attached to the horizontal member and vertically movably attached to the vertical member. The bezel is movable from a first position in which the bent plates are engaged with the locking plates and the bezel covers the opening to a second position in which the bezel is moved away from the opening without detached from the chassis. Electronic components mounted in the chassis are therefore movable through the opening for maintenance.

12 Claims, 10 Drawing Sheets

BEZEL MOUNTING DEVICE

BACKGROUND OF THE INVENTION

1. Field of the Invention

The present invention relates to a device for mounting a bezel to a chassis, and particularly to a bezel mounting device that allows convenient maintenance of electronic components within a chassis such as a computer chassis.

2. Related Art

A server assembly typically comprises a cabinet and a plurality of chassis accommodated within the cabinet. Electronic devices are mounted in each of the chassis. A bezel is often attached to the cabinet in a front of each chassis via screws. However, it is complicated and time-consuming to use screws.

To solve the above mentioned problem, a kind of detachable locking device has been developed. Taiwan Patent Issue No. 482370 discloses a detachable locking device for attaching a bezel to a front wall of a chassis of a server. The bezel defines a pair of through holes on each of opposite sides thereof. The front wall defines a plurality of screw holes corresponding to the through holes of the bezel. Screws are extended through the through holes to engage in the screw holes. A pair of latches is formed on opposite sides of the front wall for engaging with the bezel. Use of the latches can reduce the number of the screws. However, some screws are still needed to secure the bezel to the chassis. This makes it inconvenient to secure or detach the bezel to or from the chassis. Furthermore, the bezel is usually detached from the chassis when electronic components mounted within the chassis require maintenance. The bezel is liable to be misplaced or mishandled in some way while it remains a separate part.

SUMMARY OF THE INVENTION

Accordingly, an object of the present invention is to provide a bezel mounting device for a chassis which allows convenient maintenance of electronic components within the chassis.

To achieve the above-mentioned object, a bezel mounting device of the present invention comprises a pair of sliding units, a pair of locking plates attached to opposite side plates of a chassis and a cabinet which receives the chassis therein, and a pair of bent plates attached to opposite ends of a bezel. The sliding units each comprises a horizontal member attached to a corresponding side plate of the chassis, a vertical member attached to a corresponding end of the bezel, and a sliding member horizontally movably attached to the horizontal member and vertically movably attached to the vertical member. Each locking plate defines a locking aperture. Each bent plate forms a protrusion. The bezel is movable from a first position in which the protrusions are engaged in the locking apertures and the bezel covers the opening of the chassis to a second position in which the protrusions are disengaged from the locking apertures and the bezel is moved away from the opening of the chassis without detached from the chassis. Electronic components mounted in the chassis are therefore movable through the opening for maintenance.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
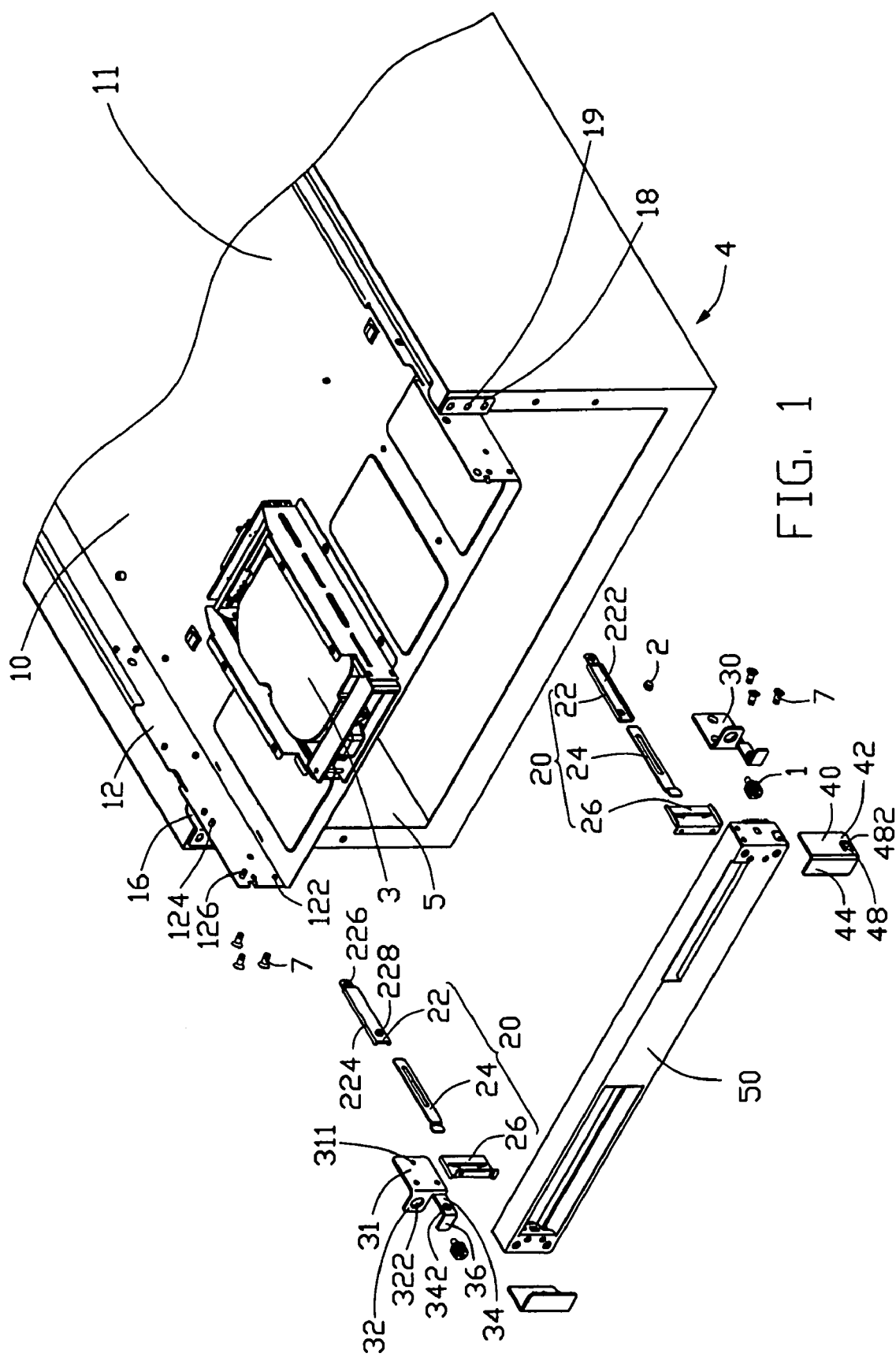
FIG. 1 is an exploded, isometric view of a bezel mounting device in accordance with the present invention, together with a bezel, a chassis on which a data storage device is mounted, and a cabinet housing the chassis therein.

FIG. 1 shows a bezel mounting device in accordance with the present invention for mounting a bezel 50 to a chassis 10. The chassis 10 is mounted in a cabinet 4. The cabinet 4 comprises a pair of sidewalls 5. Each sidewall 5 has a rail 16 secured thereon. The rail 16 comprises a bent tab 18 formed in a front portion thereof. A screw aperture 19 is defined in a middle of the bent tab 18. The chassis 10 comprises a bottom plate 11 and a pair of side plates 12. The bottom plate 11 and the side plates 12 cooperatively define an opening (not labeled) therebetween at a front of the chassis 10. A storage device 3 is mounted on a front portion of the bottom plate 11. Each side plate 12 forms a projection 124 on an inside of a front portion thereof. A pillar 126 is inwardly formed from each side plate 12 in front of the projection 124. The pillar 126 has a same height as the projection 124. The pillar 126 is hollow and has an internal thread. A plurality of screw holes 122 is defined in the front portion of each side plate 12.

The bezel mounting device comprises a pair of sliding units 20, a pair of locking plates 30, and a pair of bent plates 40. Each sliding unit 20 comprises a horizontal member 22, a sliding member 24, and a vertical member 26. The horizontal member 22 comprises a body 222, and a pair of flanges 224 extending from opposite top and bottom edges of the body 222 respectively. The body 222 and the flanges 224 cooperatively define a sliding space therebetween. A locking hole 226 is defined in a rear portion of the horizontal member 22, for fittingly receiving a corresponding projection 124 of the chassis 10. A through hole 228 is defined in a front portion of the horizontal member 22, for extension of a screw 2 therethrough to engage in a corresponding pillar 126 of the chassis 10. The sliding member 24 is for being slidably received in the sliding space of the horizontal member 22.

Figure 2:
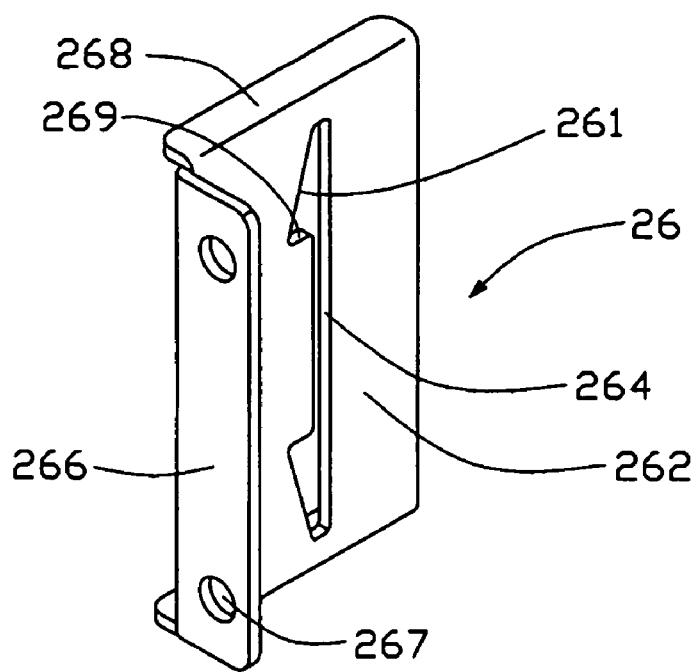
FIG. 2 is an enlarged view of a vertical member of the bezel mounting device of FIG. 1.
Figure 3:
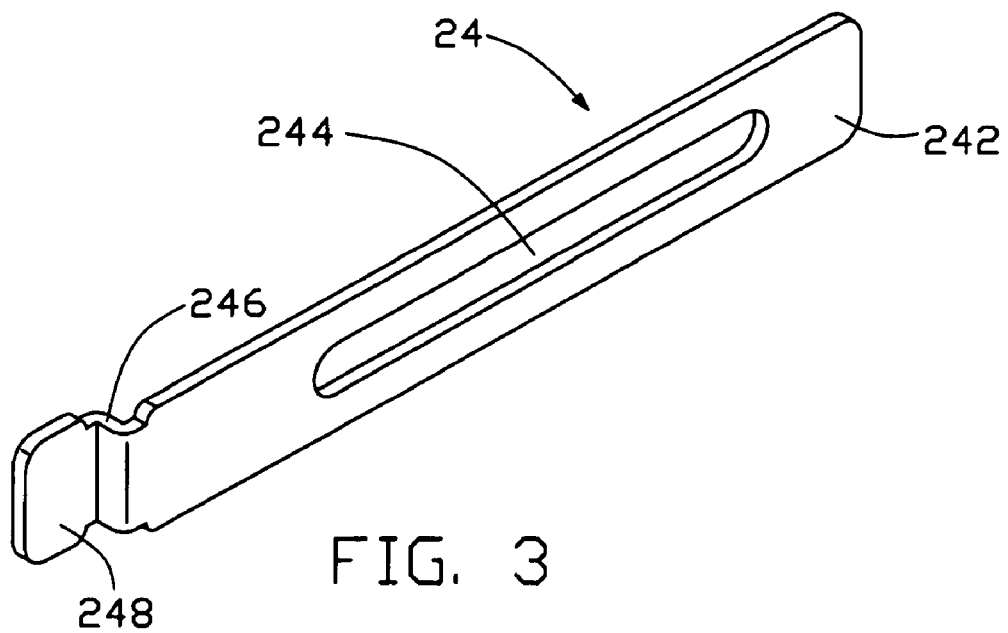
FIG. 3 is an enlarged view of a sliding member of the bezel mounting device of FIG. 1.

Referring also to FIGS. 2-3, the sliding member 24 comprises a body 242, a bent section 246 extending from one end of the body 242, and an extension section 248 extending from the bent section 246. The extension section 248 is parallel to and offset from the body 242. An elongate groove 244 is defined in the body 242, for slidingly receiving the screw 2 therein. The vertical member 26 comprises a base 262, a bent plate 266 extending from a vertical side edge of the base 262, and a pair of flanges 268 extending from opposite top and bottom edges of the base 262 respectively. A slot 264 is defined in the base 262. The slot 264 comprises a pair of symmetrical V-shaped portions in opposite ends thereof respectively. Accordingly, a shoulder 269 is formed in the base 262 at a bottom of a top one of the V-shaped portions, and another shoulder 269 is formed in the base 262 at a top of a bottom one of the V-shaped portions. A pair of inclined walls 261 is formed in the base 262 between the opposite ends of the slot 264 and the shoulders 269, respectively. A pair of locking holes 267 is defined in the bent plate 266.

Referring to FIG. 1, each locking plate 30 is for attaching to an outside of a corresponding side plate 12 of the chassis 10. The locking plate 30 comprises a body 31, a bent portion 32 extending from an upper portion of a front edge of the body 31, an elastic portion 34 extending from a lower portion of the front edge of the body 31, and an operation portion 36 extending from the elastic portion 34. A plurality of through holes 311 is defined in the body 31, for extension of a corresponding number of screws 7 therethrough. A through aperture 322 is defined in the bent portion 32, for extension of a captive screw 1 therethrough to engage in the screw aperture 19 of a corresponding rail 16. A locking aperture 342 is defined in the elastic portion 34. The bent plates 40 are for attaching to opposite ends of the bezel 50 respectively. Each bent plate 40 has an L-shaped cross section, and comprises a first part 42 and a second part 44. An elastic tab 48 is formed in a bottom portion of the first part 42. A protrusion 482 is formed on a free end of the elastic tab 48. A pair of posts 46 (see FIG. 7) is formed on an inside of the second part 44.

Figure 4:
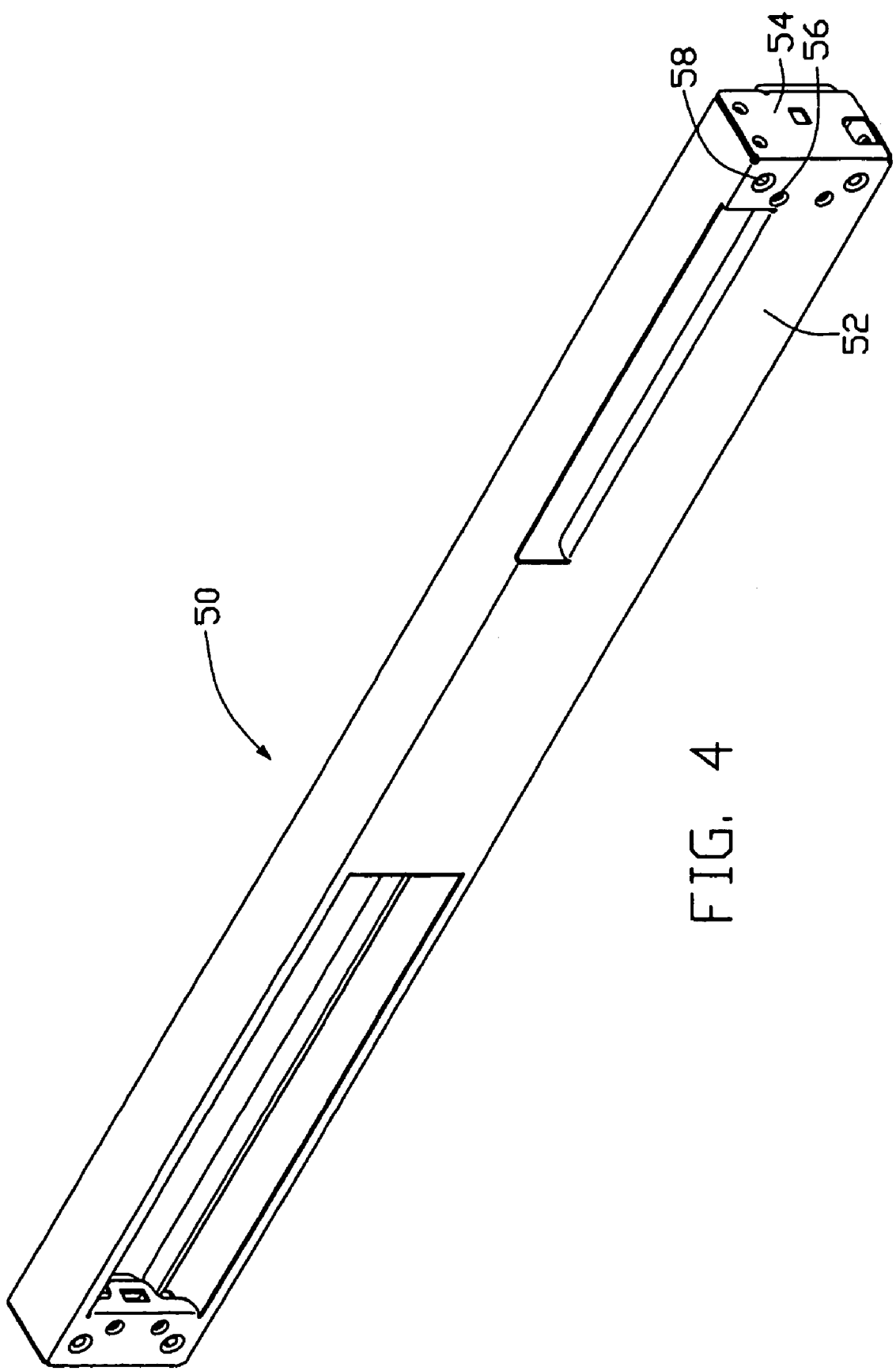
FIG. 4 is an enlarged view of the bezel of FIG. 1.

Referring to FIG. 4, the bezel 50 comprises a front wall 52 and a pair of opposite sidewalls 54. A pair of locking holes 56 is defined in each of opposite ends of the front wall 52, the locking holes 56 corresponding to the posts 46 of the bent plates 40. A pair of posts 58 (see also FIG. 7) is formed on an inside of each of the opposite ends of the front wall 52, the posts 58 corresponding to the locking holes 267 of the vertical members 26.

Figure 5:
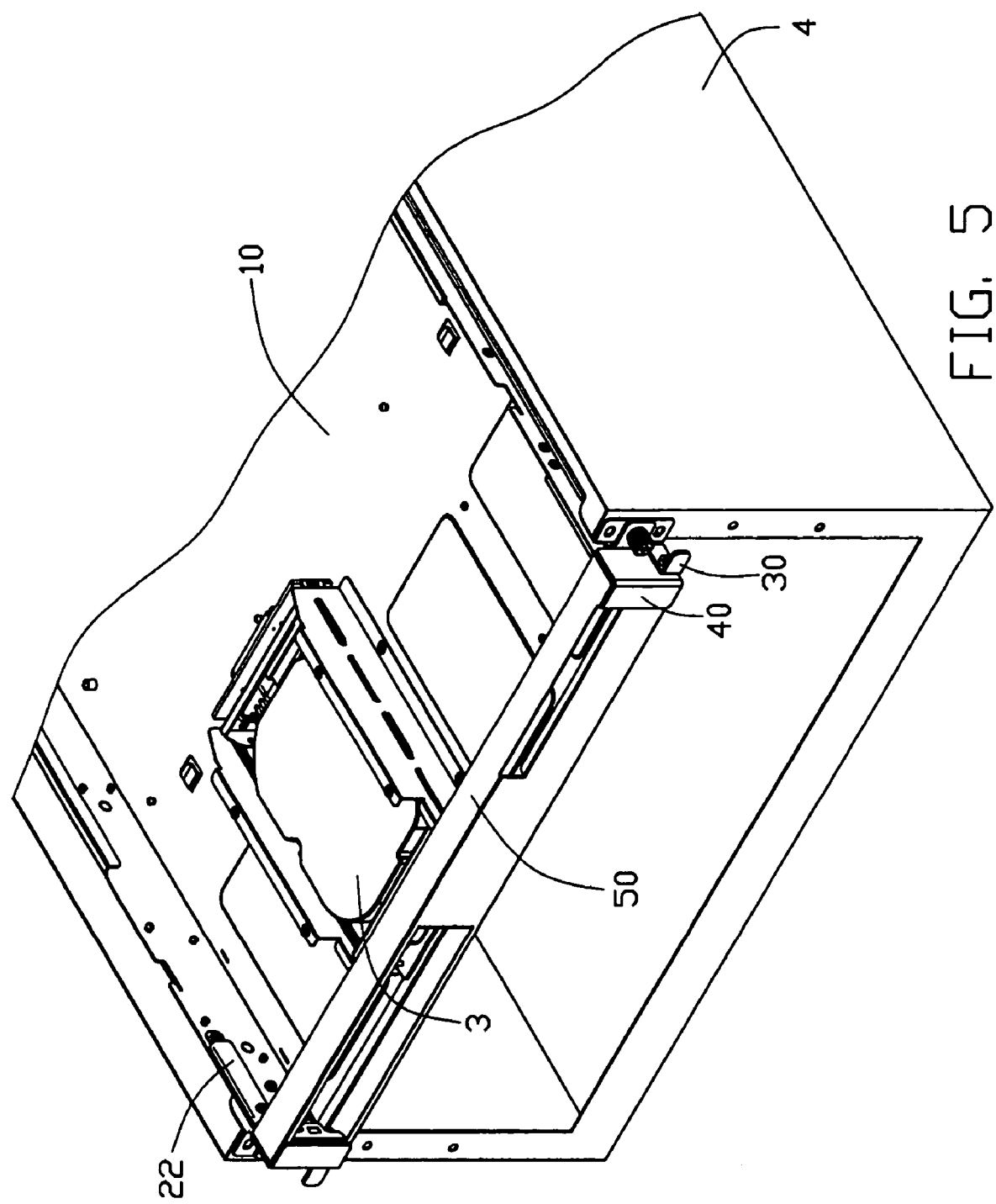
FIG. 5 is an assembled view of FIG. 1.
Figure 6:
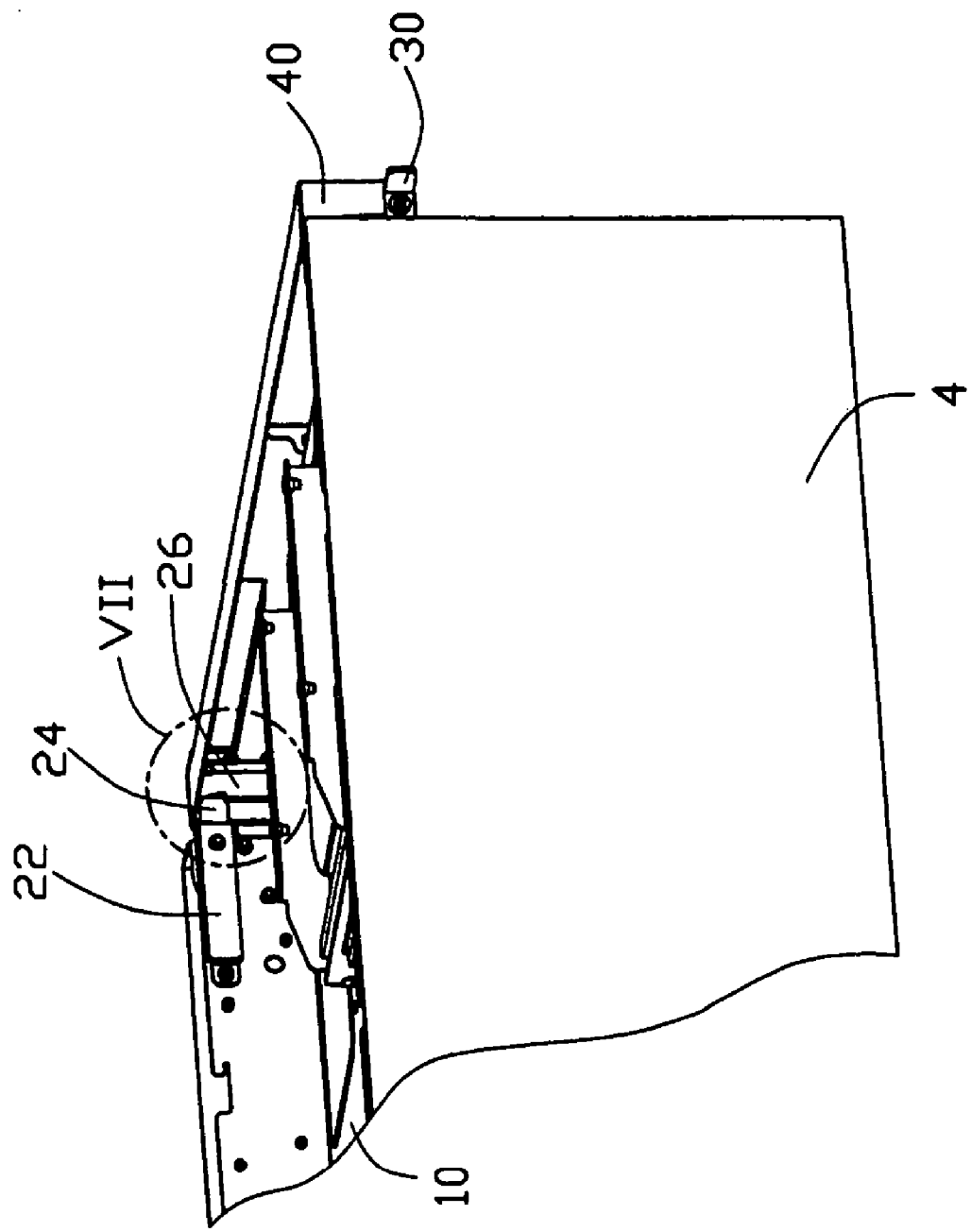
FIG. 6 is similar to FIG. 5, but viewed from another aspect.
Figure 7:
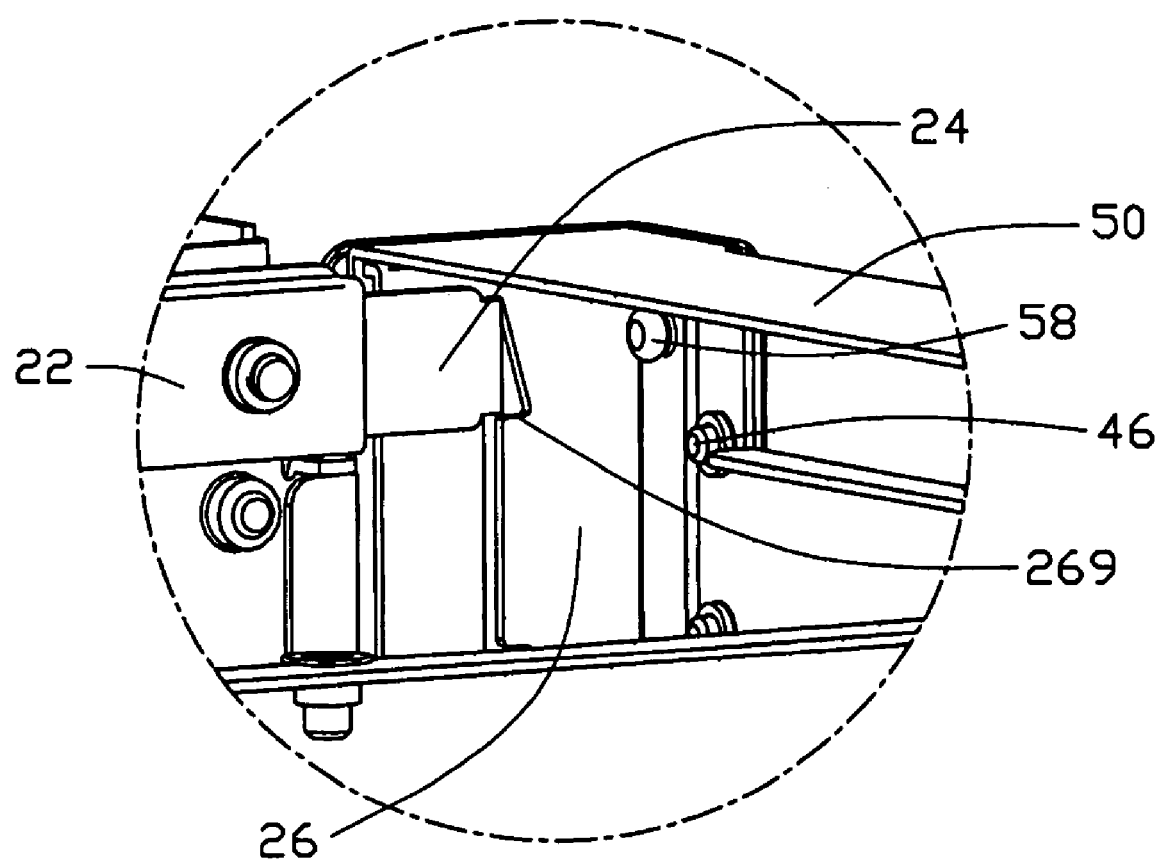
FIG. 7 is an enlarged view of an encircled portion VII of FIG. 6.
Figure 8:
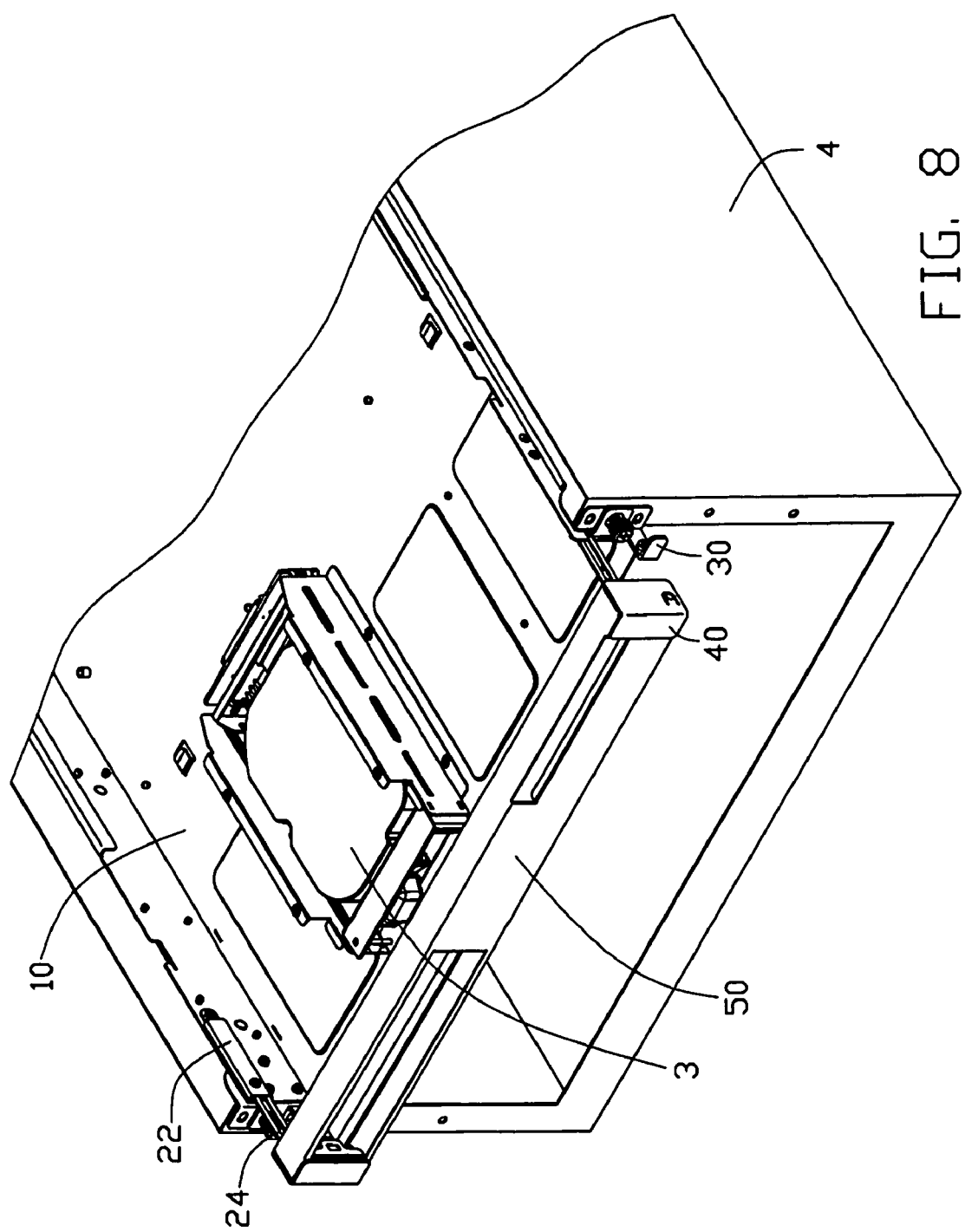
FIGS. 8-9 are similar to FIG. 5, but show successive stages in detaching the bezel from the cabinet.
Figure 9:
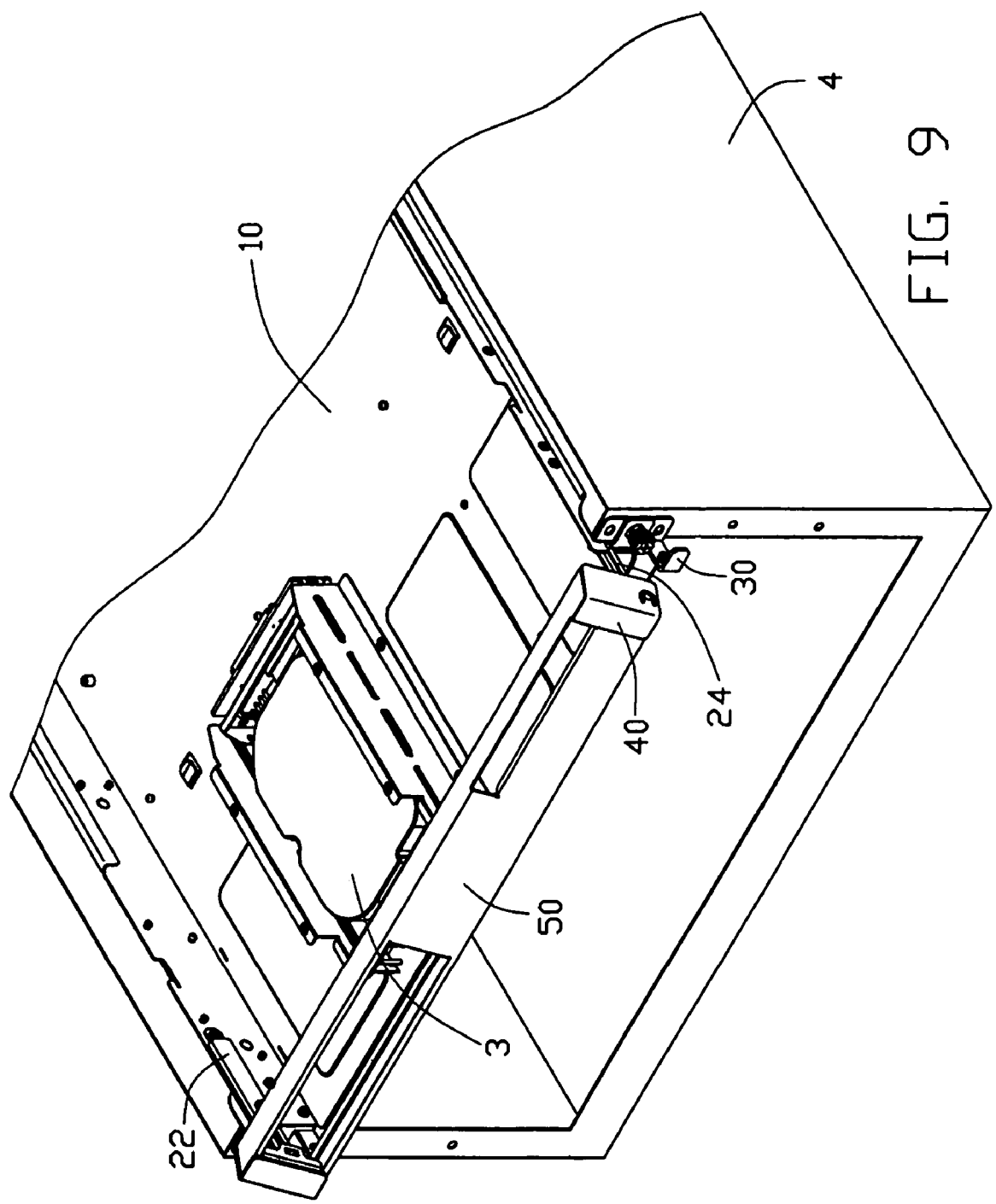
Figure 10:
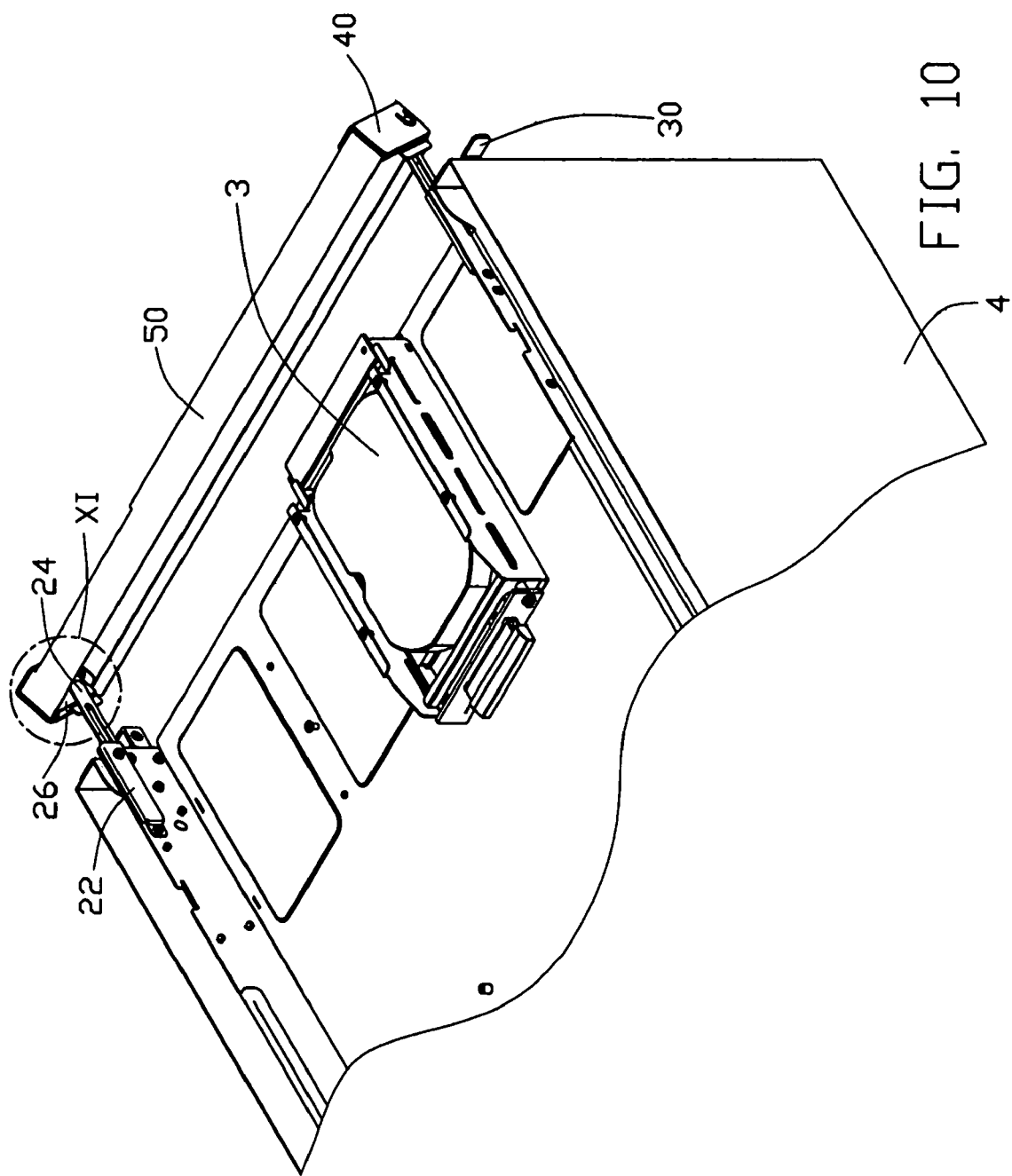
FIG. 10 is similar to FIG. 9, but viewed from another aspect.
Figure 11:
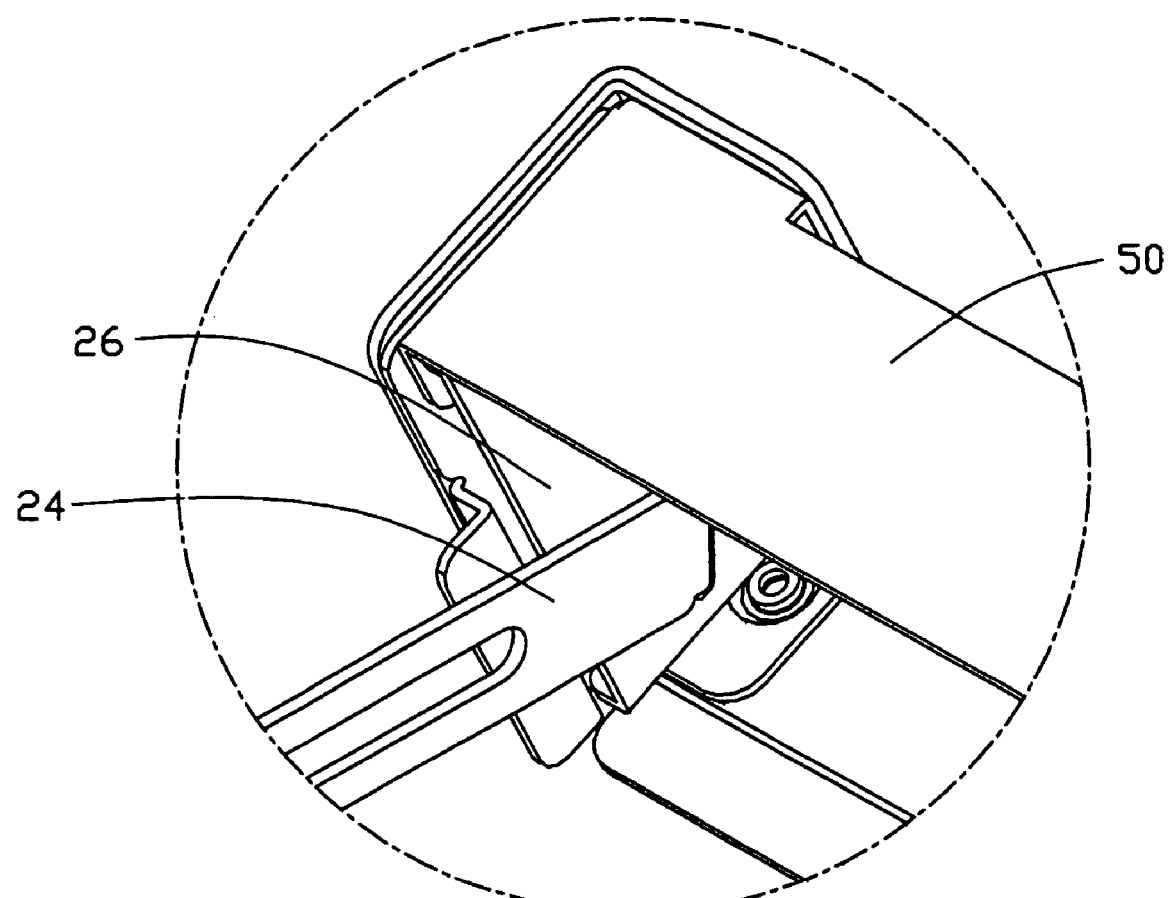
FIG. 11 is an enlarged view of an encircled portion XI of FIG. 10.

Referring to FIGS. 5-7, in assembly, the locking plates 30 are attached to the outsides of the side plates 12 of the chassis 10, with the screws 7 being extended through the through holes 311 of the locking plates 30 to engage in the screw holes 122 of the chassis 10. The combined chassis 10 and locking plates 30 is attached to the cabinet 4 between the rails 16. The captive screws 1 are extended through the through apertures 322 of the locking plates 30 and engaged in the screw apertures 19 of the rails 16. The horizontal members 22 of the sliding units 20 are attached to the insides of the side plates 12 of the chassis 10, with the projections 124 of the chassis 10 fittingly extending through the locking holes 226 of the horizontal members 22. The sliding members 24 are slidably received in the sliding spaces of the horizontal members 22. The screws 2 are extended through the grooves 244 of the sliding members 24 and the through holes 228 of the horizontal members 22 and engaged in the pillars 126 of the chassis 10. The bent plates 40 are attached to the opposite ends of the bezel 50 respectively. The posts 46 of the bent plates 40 are received in the locking holes 56 of the bezel 50. The vertical members 26 of the sliding units 20 are attached to an inside of the front wall 52 of the bezel 50, with the posts 58 of the bezel 50 being received in the locking holes 267 of the vertical members 26. The extension section 248 of each sliding member 24 is extended through the slot 264 of a corresponding vertical member 26, and is received in a space formed between the bases 262, the flanges 268 of the vertical members 26 and a corresponding sidewall 54 of the bezel 50 (see FIG. 7). The bent section 246 of each sliding member 24 is received in the top V-shaped portion of the slot 264 of the corresponding vertical member 26. The protrusions 482 of the bent plates 40 are received in the locking apertures 342 of the locking plates 30. Thus, the bezel 50 is firmly secured to the chassis 10 and the cabinet 4, and covers the opening of the chassis 10.

Referring to FIGS. 8-11, when the data storage device 3 requires maintenance, the operation portions 36 of the locking plates 30 are pulled outwardly. The protrusions 482 of the bent plates 40 are released from the locking apertures 342 of the locking plates 30. The bezel 50 is thus drawn forward away from the chassis 10 until the screws 2 reach front ends of the grooves 244. The bezel 50 is then moved upwardly. The vertical members 26 of the sliding units 20 move upwardly relative to the sliding members 24 until the bent sections 246 of the sliding members 24 reach bottom ends of the slots 264 of the vertical members 26. The bezel 50 is then tilted toward the chassis 10. The vertical members 26 are tilted relative to the sliding members 24 until the inclined walls 261 abut the bent sections 246 of the sliding members 24. In this position, the bottom shoulders 269 of the vertical members 26 are supported on the bent sections 246 of the sliding members 24. The bezel 50 is thus located above and away from the opening of the chassis 10. The data storage device 3 is then removed from the chassis 10 through the opening. After maintenance, the data storage device 3 is put back in the chassis 10. The bezel 50 is secured to the chassis 10 by a process substantially the reverse of the above-described process.

In the present invention, when the data storage device 3 requires maintenance, the bezel 50 can be moved away from the opening of the chassis 10 to provide access to the data storage device 3 without the need for detachment of the bezel 50 from the chassis 10. The bezel 50 cannot be misplaced, and is not subject to the vicissitudes of a separately stored part.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A mounting device assembly comprising:
   a cabinet;
   a chassis slidably mounted within the cabinet, the chassis comprising a pair of side plates and an opening formed between the side plates;
   an electronic component received in the chassis and being movable through the opening;
   a bezel; and
   a mounting device for mounting the bezel to the chassis, the mounting device comprising:
   a sliding unit connected between the chassis and the bezel;
   a locking plate attached to the chassis and the cabinet for retaining the chassis in the cabinet; and
   engaging means for releasably engaging the bezel with the locking plate, wherein
   the bezel is movable from a first position in which the bezel is engaged with the locking plate and covers the opening of the chassis to a second position in which the bezel is disengaged from the locking plate and slid along an up-to-down direction and then tilted along an inclined direction different from the up-to-down direction in that sequence to move away from the opening of the chassis without being detached from the chassis, thereby allowing the electronic component to be removed through the opening;

wherein the engaging means comprises locking aperture defined in the locking plate, and a protrusion formed in a bent plate which is attached to one end of the bezel, the protrusion being received in the locking aperture when the bezel is located at the first position.

2. The mounting device assembly as claimed in claim 1, wherein the sliding unit comprises a first member attached to a corresponding side plate of the chassis, and a second member attached to the bezel, the second member being movable relative to the first member in horizontal and vertical directions.

3. The mounting device assembly as claimed in claim 2, wherein the sliding unit further comprises a third member horizontally movably attached to the first member and vertically movably attached to the second member.

4. The mounting device assembly as claimed in claim 3, wherein the second member defines a vertical slot, the third member comprises a body, a bent section. and an extension section parallel to and offset from the body, and the extension section is extended through the slot to cause the bent section to be received in the slot.

5. The mounting device assembly as claimed in claim 4, wherein the slot comprises a first V-shaped portion formed in one end thereof, a shoulder is formed in the second member at a top end of the V-shaped portion, and wherein the shoulder rests on the bent section of the third member when the bezel is located at the second position.

6. The mounting device assembly as claimed in claim 5, wherein an inclined wall is formed in the second member between the shoulder and said end of the slot, and the inclined wall abuts the bent section of the third member when the bezel is located at the second position.

7. The mounting device assembly as claimed in claim 1, wherein the locking plate comprises an elastic potion in which the locking aperture is defined, and an operation portion extending from a free end of the elastic portion for facilitating releasing of the protrusion from the locking aperture to allow the bezel to move from the first position to the second position.

8. A mounting device assembly comprising:
a chassis accommodating electronic components therein, the chassis comprising a pair of side plates;
a bezel; and
a mounting device for mounting the bezel to a front of the chassis, the mounting device comprising:
a pair of sliding units connected between the chassis and the bezel, each sliding unit comprising a fixed member attached to the bezel, and a sliding member; wherein the sliding member is slidably connected to a corresponding side plate of the chassis and movably connected to the fixed member which allows the bezel to be slid relative to the chassis and the electronic components in a front-to-back direction and moved relative to the chassis and the electronic components in an up-to-down direction to expose the electronic components in the front-to-back direction, the sliding of the bezel in the front-to-back direction and the moving of the bezel in the up-to-down direction being capable of being implemented at different time;
a pair of locking plates attached to outsides of the side elates of the chassis respectively, and a pair of bent plates attached to opposite ends of the bezel, each of the locking plates defining a locking aperture, each of the bent plates forming a protrusion received in the locking aperture when the bezel is mounted to the chassis.

9. The mourning device assembly as claimed in claim 8, wherein the fixed member defines an elongated slot slidably receiving one end of the sliding member which allow the bezel to be slid relative to the chassis and the electronic components in the up-to-down direction.

10. The mounting device assembly as claimed in claim 9, wherein the slot forms at one end thereof an inclined wall which allows the fixed member to be tilted to a tilted position relative to the sliding member to thereby allow the bezel to be tilted relative to the chassis and the electronic components, and a shoulder configured for resting on the sliding member to maintain the fixed member at the tilted position.

11. The mounting device assembly as claimed in claim 8, wherein each of the locking plates comprises an elastic portion in which the locking aperture is defined, and an operation portion extending from a free end of the elastic portion for facilitating releasing of the protrusion from the locking aperture.

12. The mounting device assembly as claimed in claim 8, wherein each of the bent plates has an L-shaped cross section and comprises a pair of posts, and each of opposite ends of the bezel defines a pair of locking holes receiving the posts therein respectively.

* * * * *